United States Patent
Lee et al.

(10) Patent No.: US 11,735,397 B2
(45) Date of Patent: Aug. 22, 2023

(54) DEVICE FOR MEASURING PLASMA ION DENSITY AND APPARATUS FOR DIAGNOSING PLASMA USING THE SAME

(71) Applicant: KOREA RESEARCH INSTITUTE OF STANDARDS AND SCIENCE, Daejeon (KR)

(72) Inventors: Hyo Chang Lee, Sejong-si (KR); Jung Hyung Kim, Daejeon (KR); Hee Jung Yeom, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 117 days.

(21) Appl. No.: 17/222,937

(22) Filed: Apr. 5, 2021

(65) Prior Publication Data
US 2022/0270852 A1    Aug. 25, 2022

(30) Foreign Application Priority Data

Feb. 19, 2021    (KR) ........................ 10-2021-0022899

(51) Int. Cl.
*H01J 37/32* (2006.01)
(52) U.S. Cl.
CPC ..... *H01J 37/3222* (2013.01); *H01J 37/32311* (2013.01); *H01J 37/32935* (2013.01); *H01J 2237/24585* (2013.01)
(58) Field of Classification Search
CPC .. H05H 1/0006; H05H 1/0012; H05H 1/0062; H05H 1/0075; H05H 1/24; H01J 37/3222; H01J 37/32311; H01J 37/32935; H01J 37/32972; H01J 37/32917; H01J 2237/24585; H01J 2237/2561; H01J 2237/2566; H01J 2237/2594
See application file for complete search history.

(56) References Cited

U.S. PATENT DOCUMENTS

| | | | |
|---|---|---|---|
| 7,061,184 B2 * | 6/2006 | Kim ................. | H01J 37/32935 315/111.21 |
| 2005/0016683 A1 | 1/2005 | Kim et al. | |
| 2008/0000585 A1 * | 1/2008 | Kim ..................... | H05H 1/0062 156/345.48 |
| 2019/0242838 A1 * | 8/2019 | Gillman ............... | H05H 1/4697 |
| 2021/0116393 A1 | 4/2021 | Lee et al. | |

FOREIGN PATENT DOCUMENTS

| | | | |
|---|---|---|---|
| JP | 2003017295 A | | 1/2003 |
| KR | 100473794 B1 | | 3/2005 |
| KR | 100805879 B1 | | 2/2008 |
| KR | 101225010 B1 | | 1/2013 |
| KR | 20170069652 A | | 6/2017 |
| KR | 101756325 B1 | | 7/2017 |
| KR | 20200095022 A | | 8/2020 |

* cited by examiner

*Primary Examiner* — Haissa Philogene
(74) *Attorney, Agent, or Firm* — STIP Law Group, LLC

(57) ABSTRACT

Disclosed herein is a device for measuring a plasma ion density, which includes a transceiver antenna configured to apply and receive a microwave, of which a frequency is varied, to and from plasma, and a frequency analyzer configured to analyze a frequency of the microwave received from the transceiver antenna and measure a cut-off frequency, wherein the frequency of the microwave applied to the plasma is varied in the range of 100 kHz to 500 MHz.

8 Claims, 18 Drawing Sheets

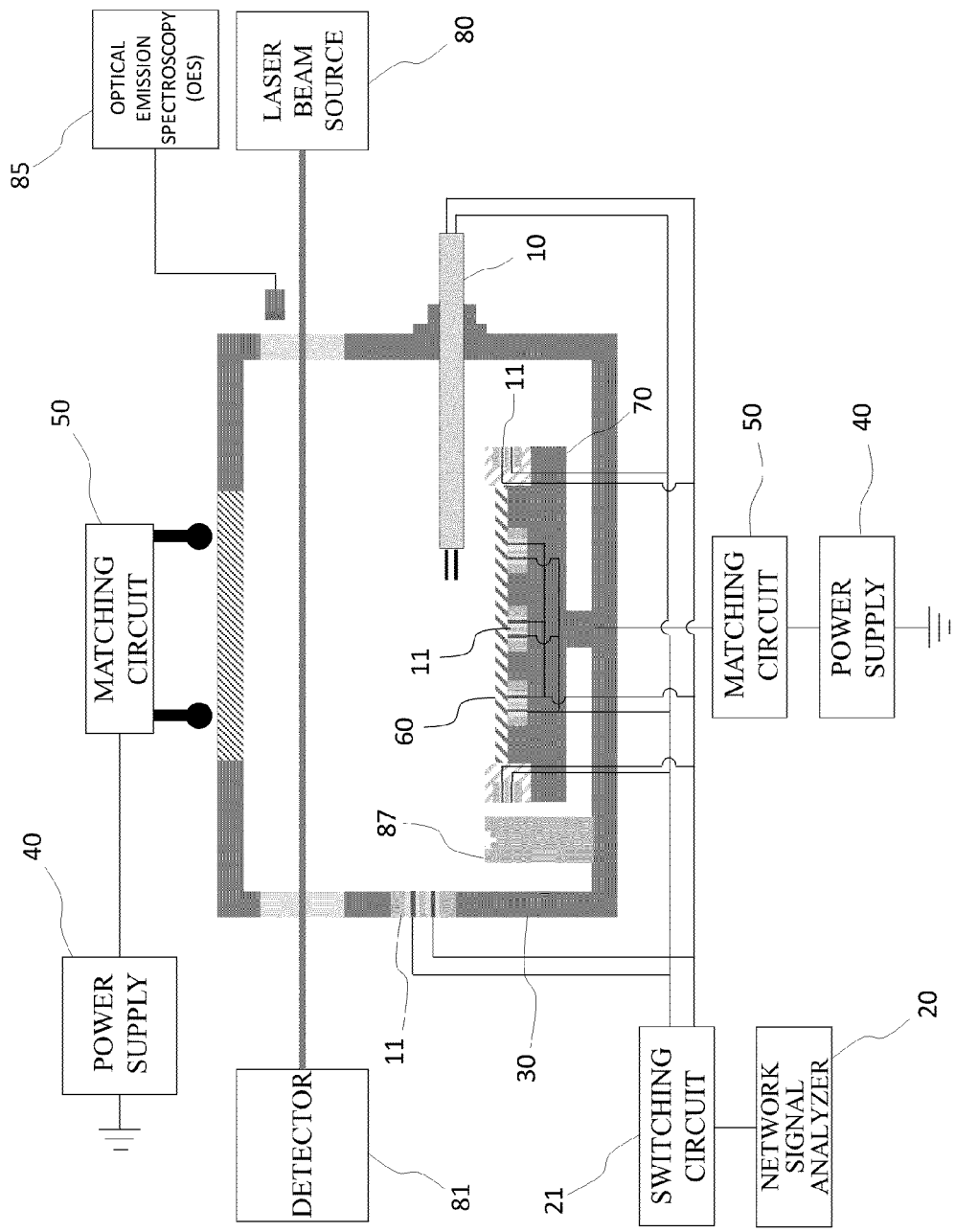
[FIG. 1]

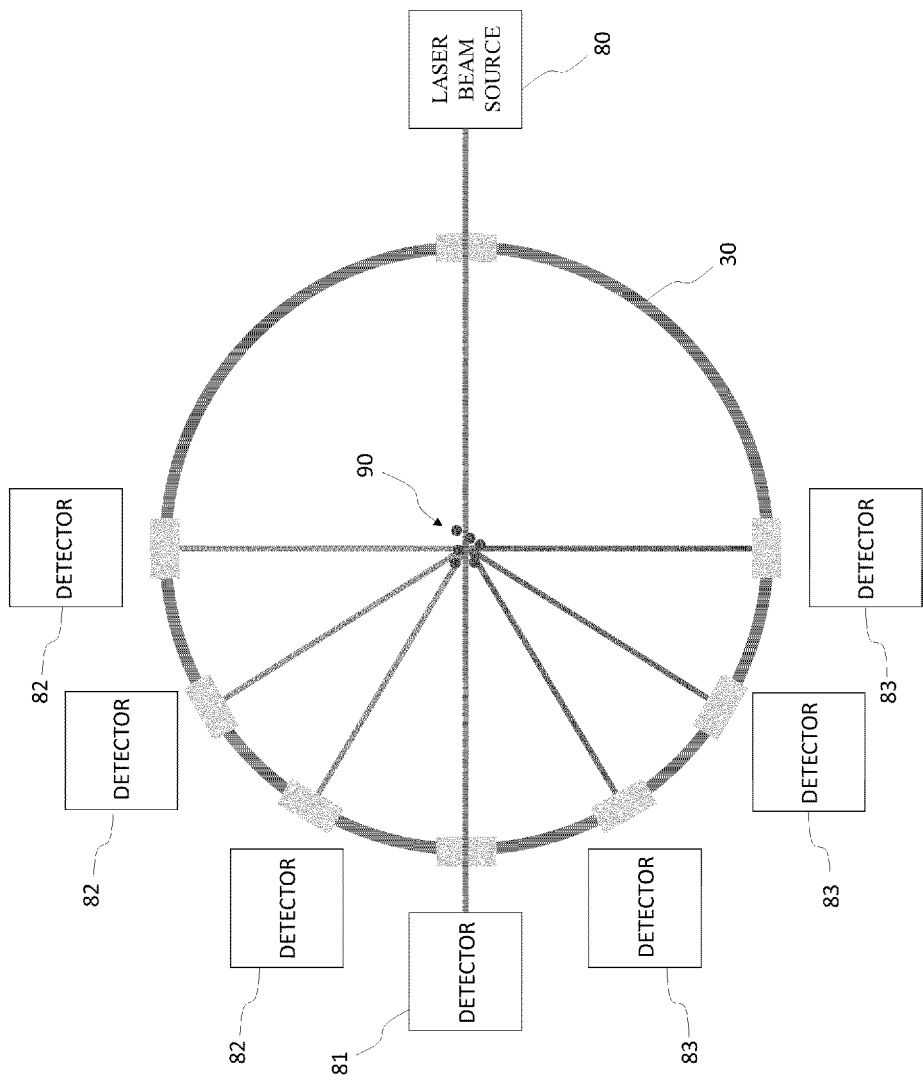
[FIG. 2]

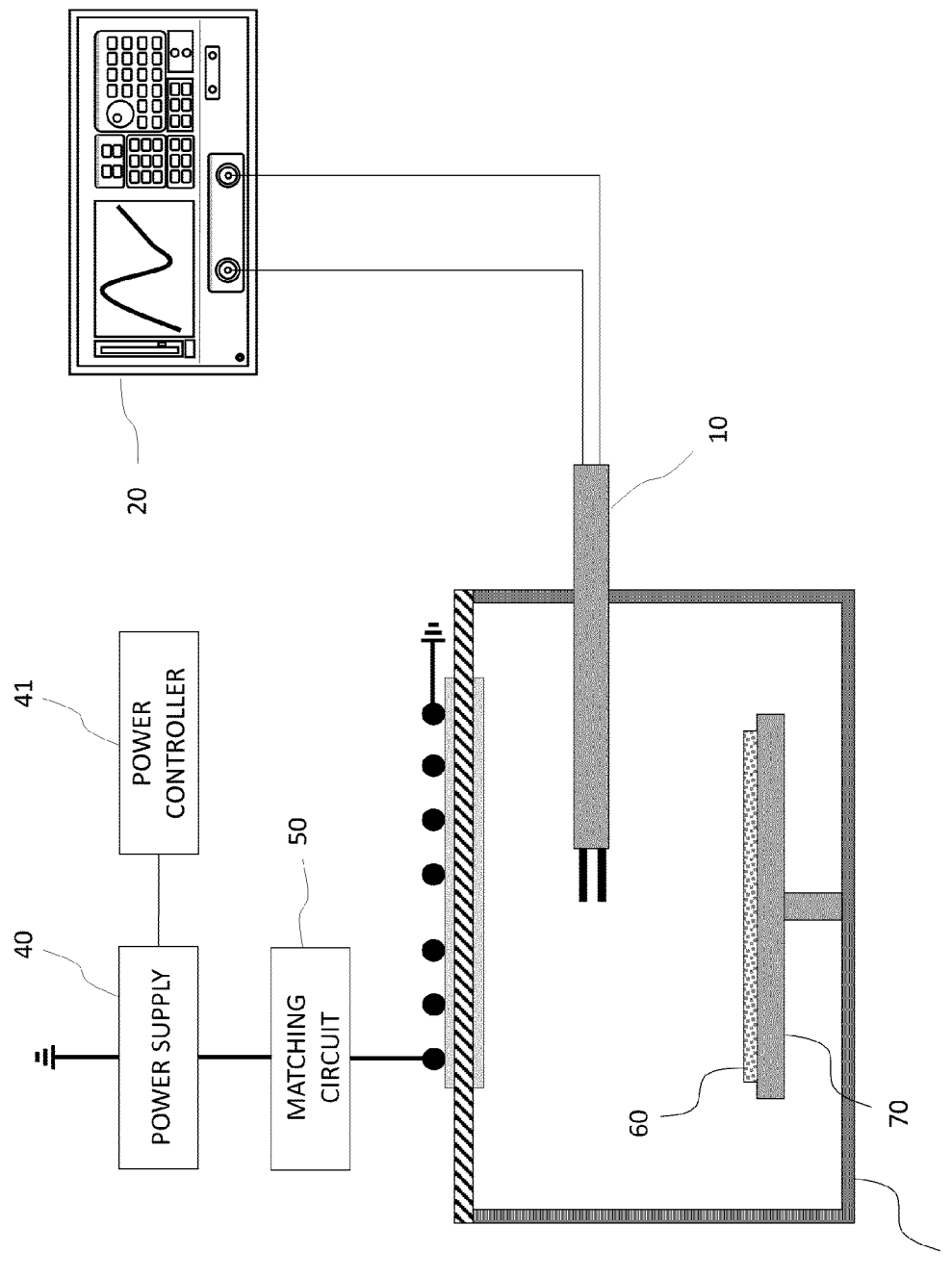
[FIG. 3]

[FIG. 4A]
(a)
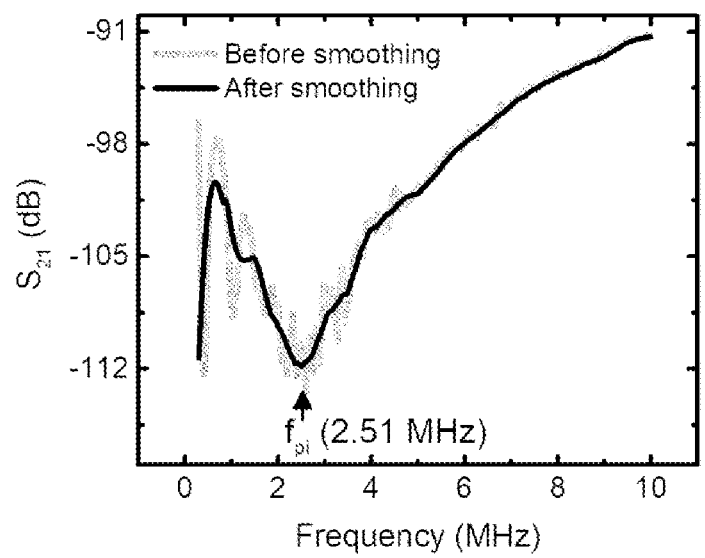
$f_{pi}$ : Measured Ion plasma frequency

[FIG. 4B]
(b)
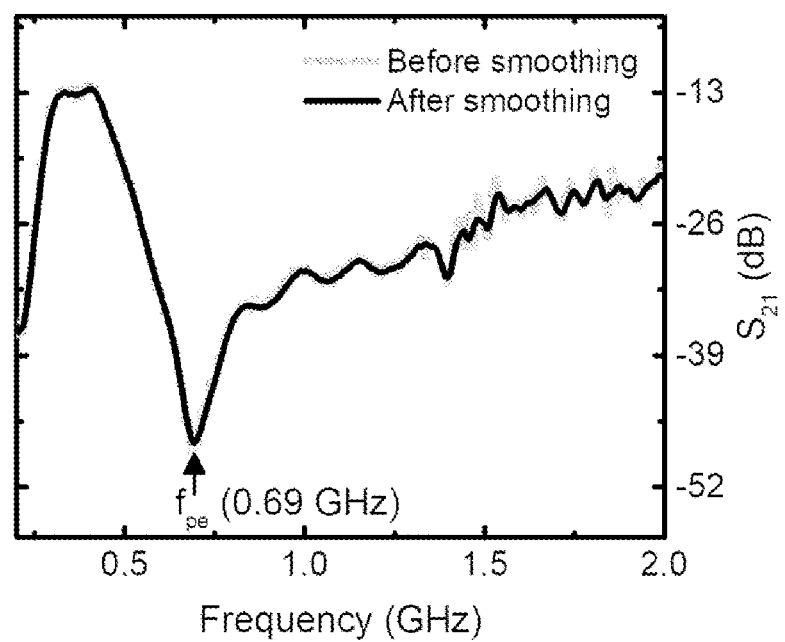
$f_{pe}$ : Measured Electron plasma frequency

[FIG. 5A] [FIG. 5B]
He
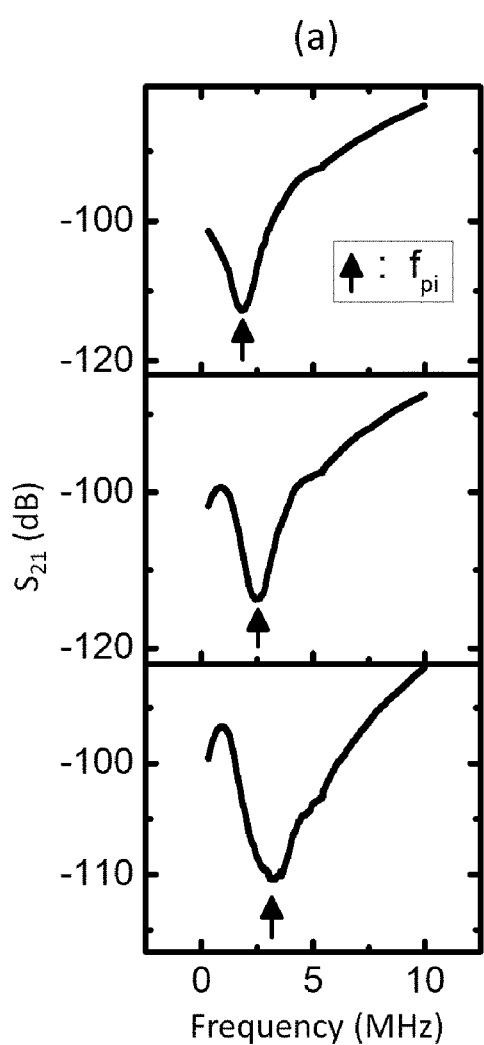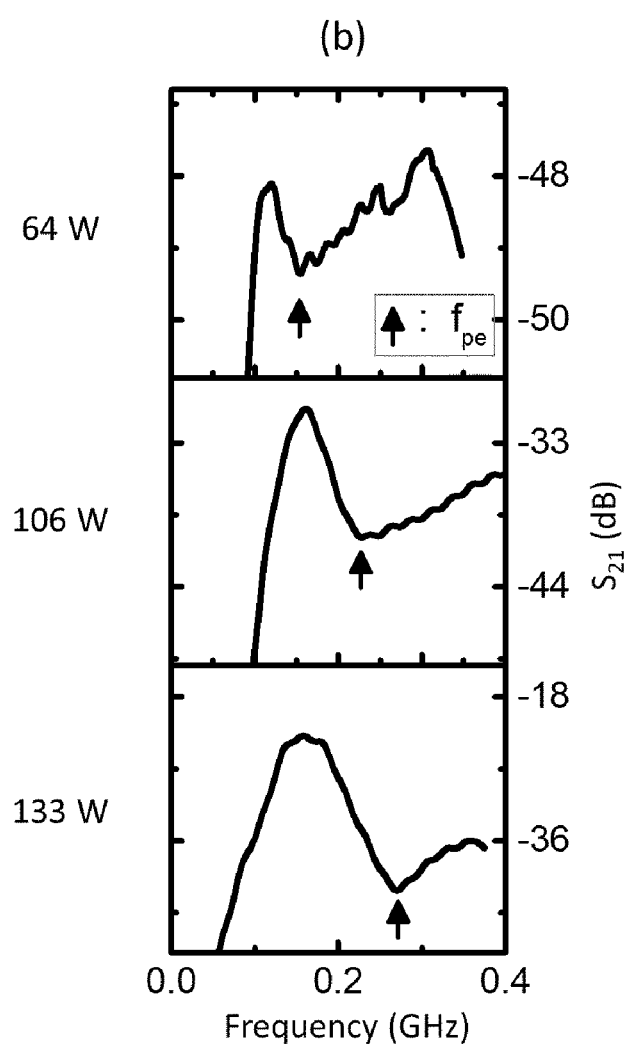

[FIG. 6A]
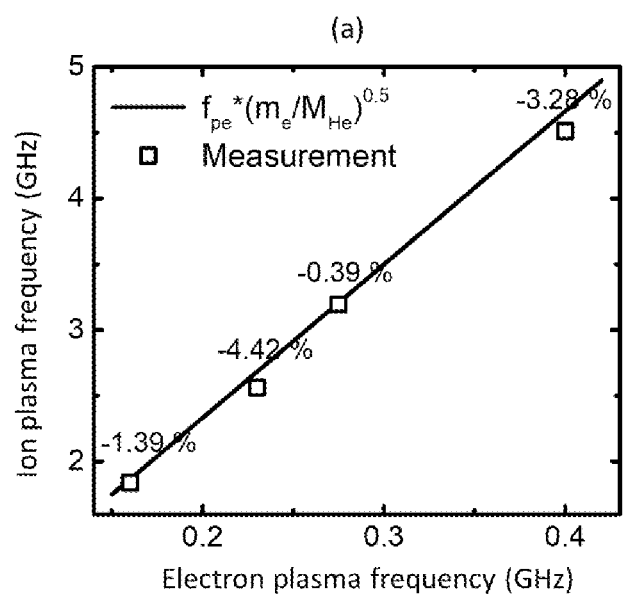
[FIG. 6B]
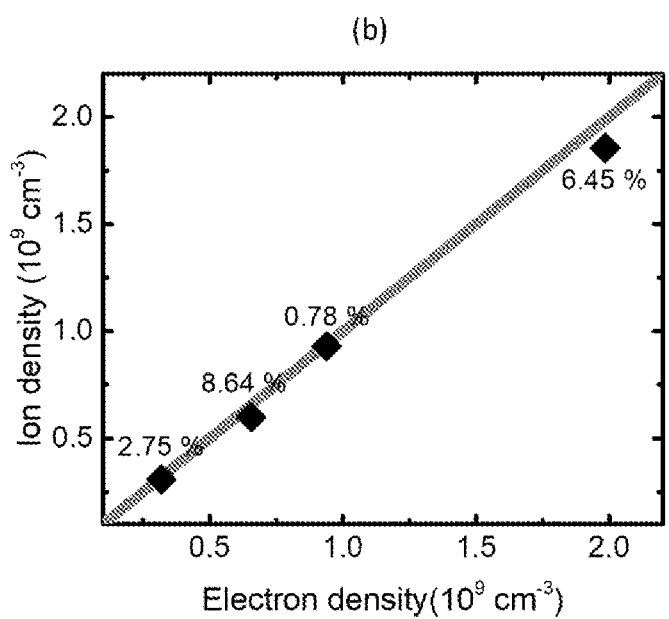

[FIG. 7A] [FIG. 7B]
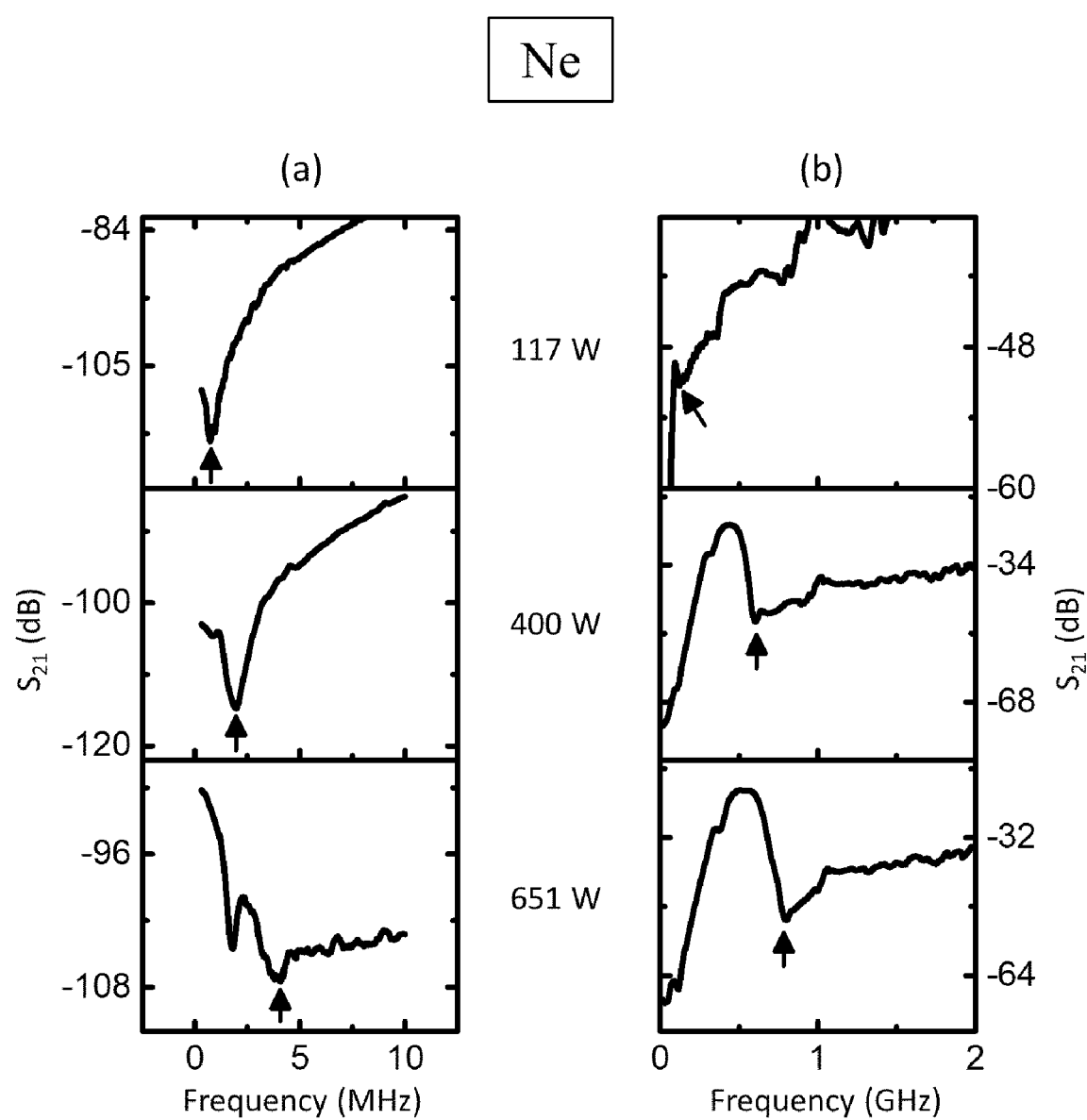

[FIG. 8A]
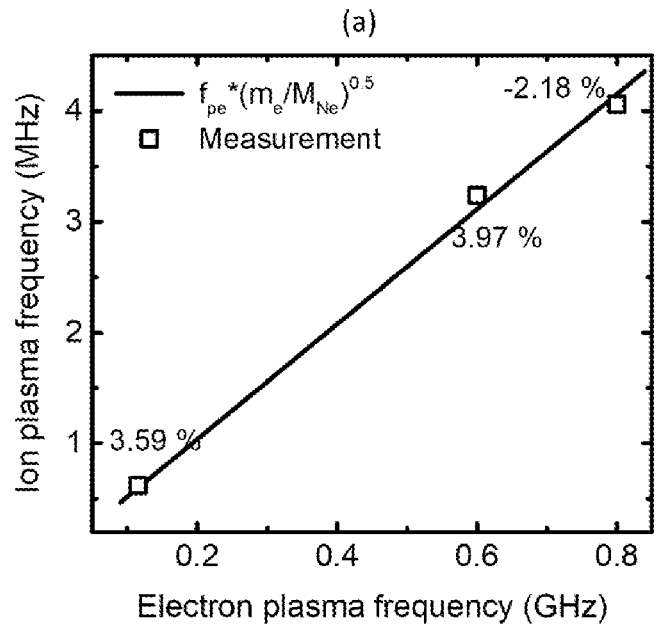
[FIG. 8B]
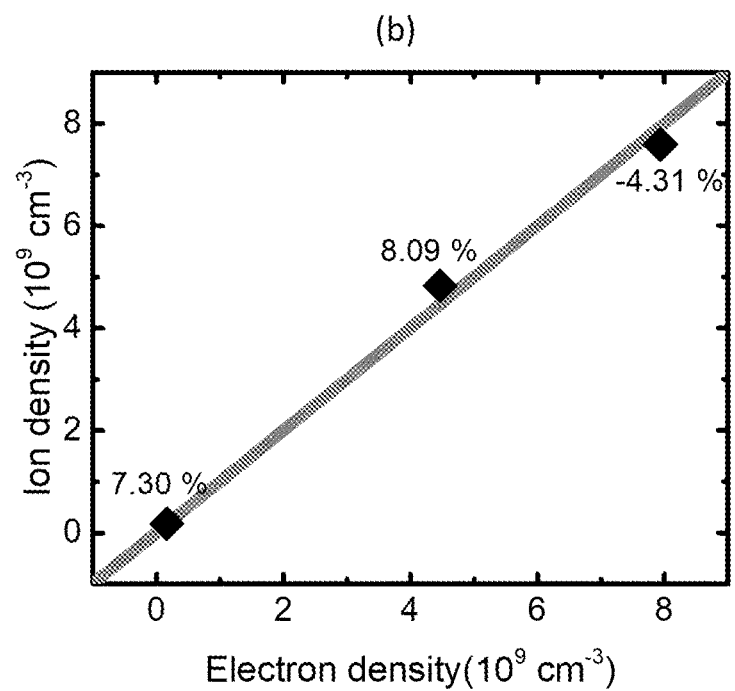

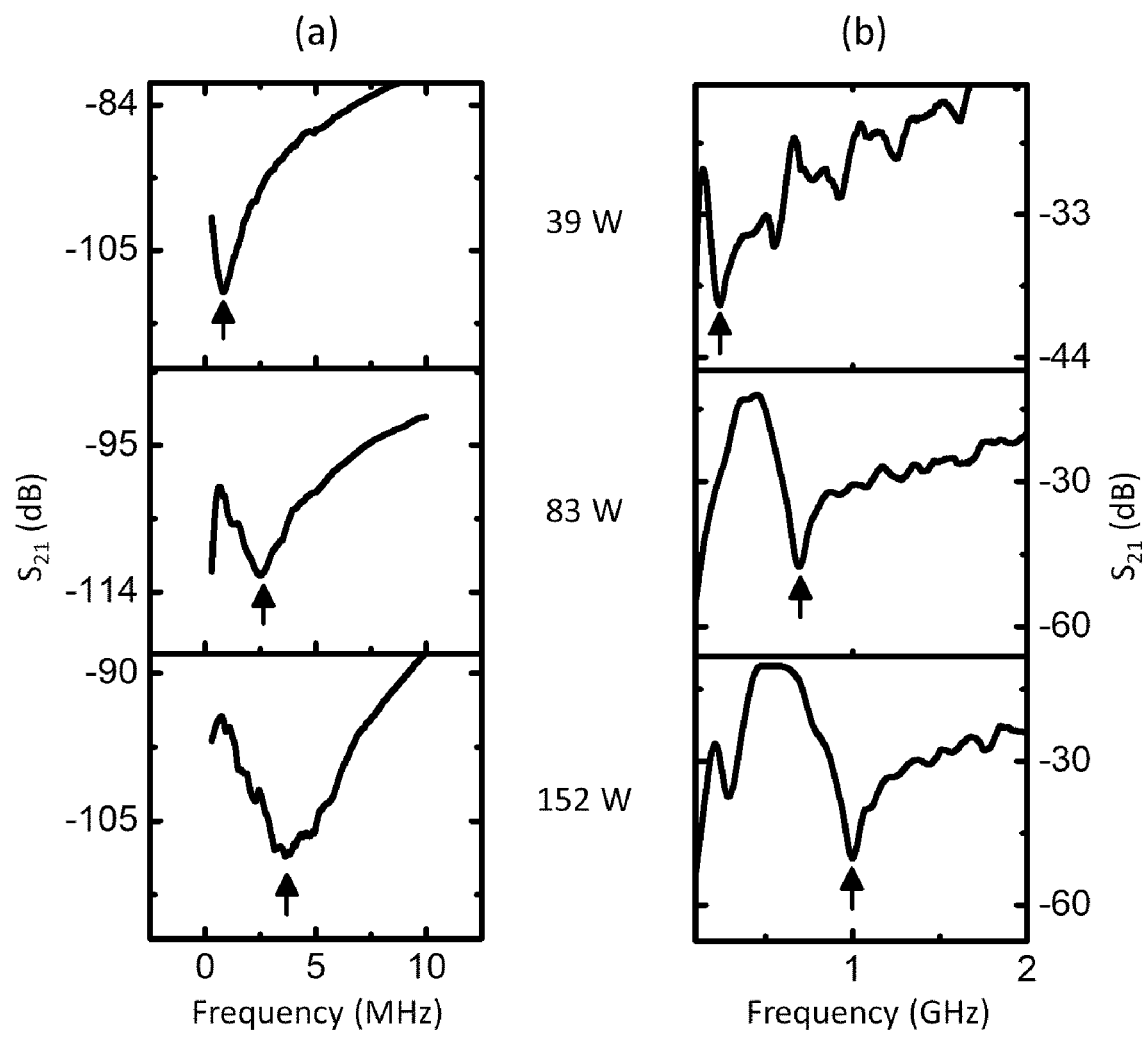

[FIG. 10A]
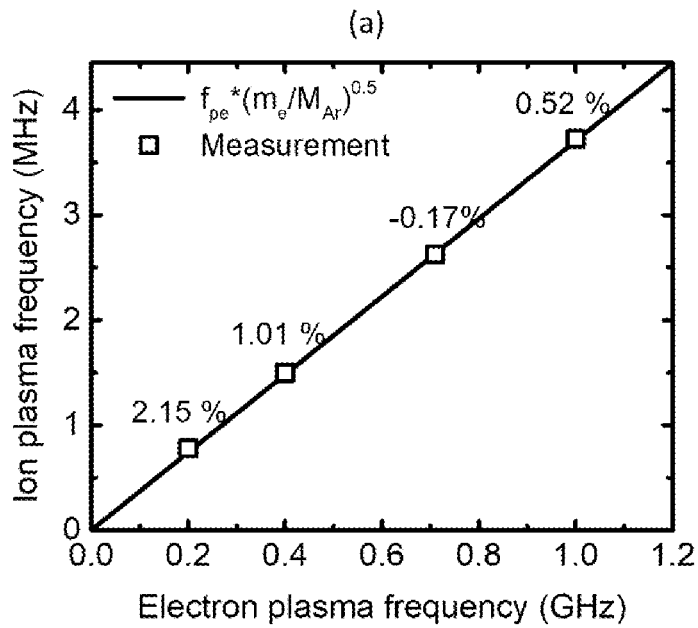
[FIG. 10B]
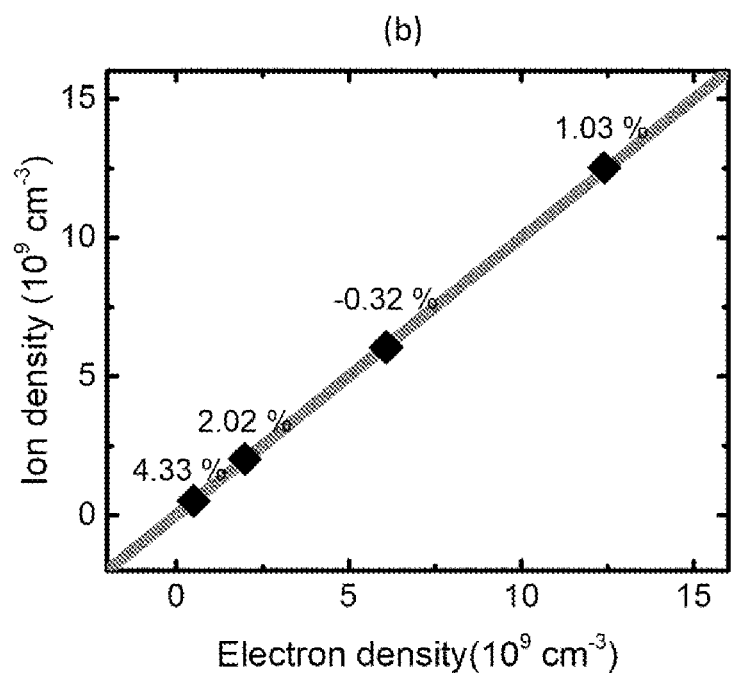

[FIG. 11A]
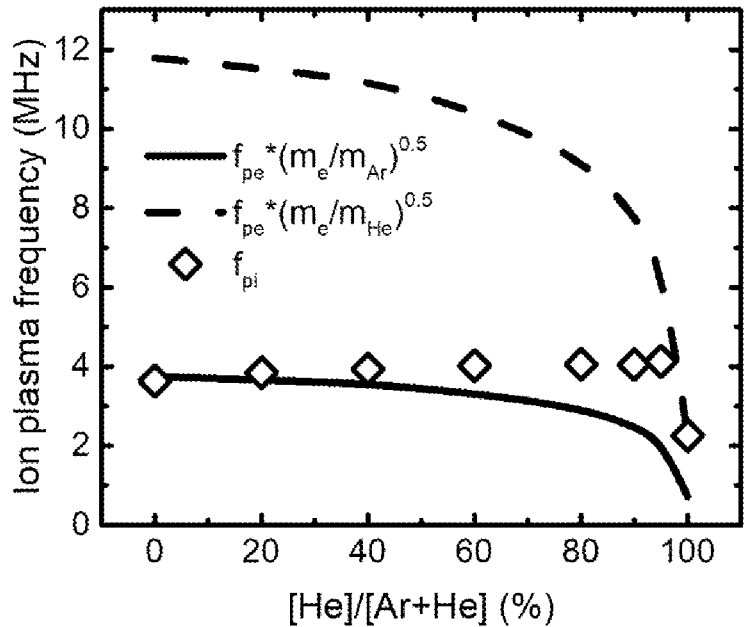
[FIG. 11B]
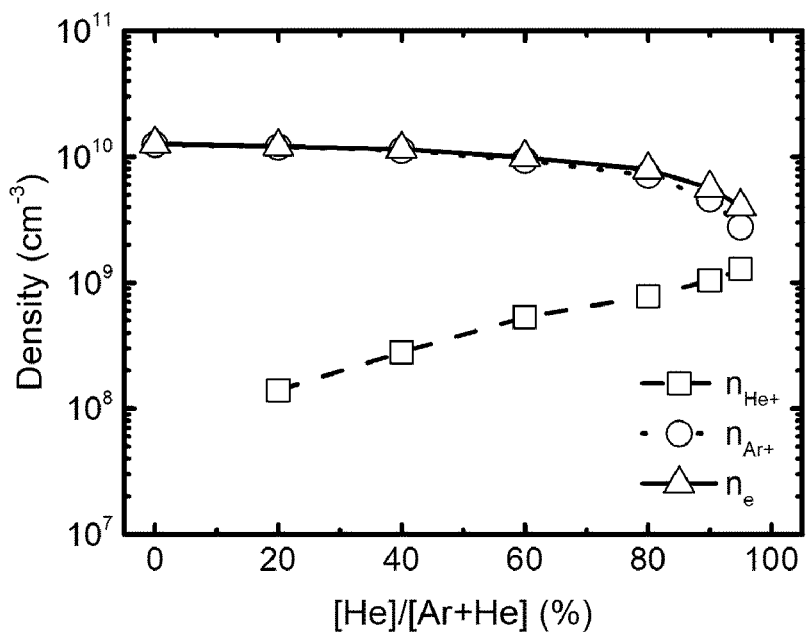

[FIG. 12A]
(a)
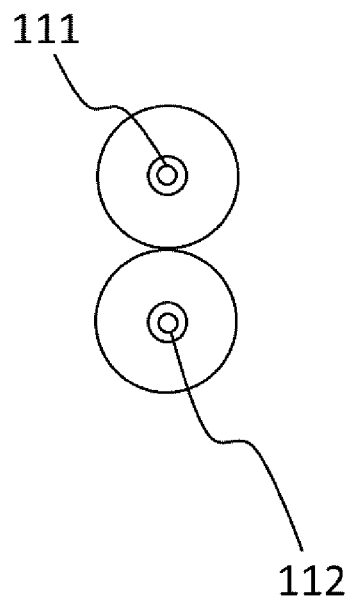
[FIG. 12B]
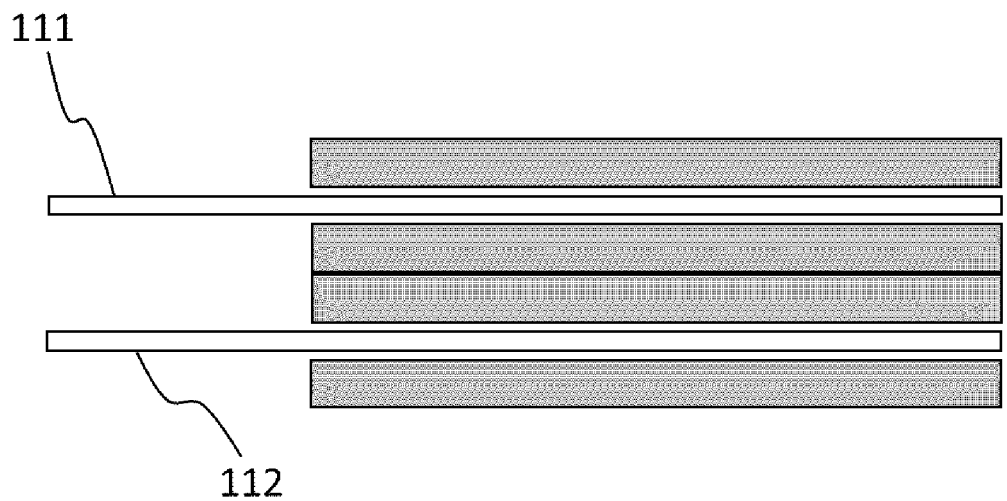

[FIG. 13A]
(a)
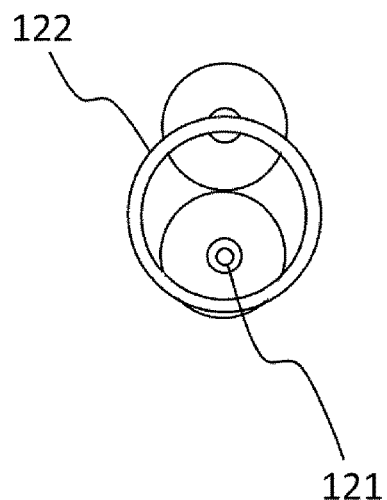
[FIG. 13B]
(b)
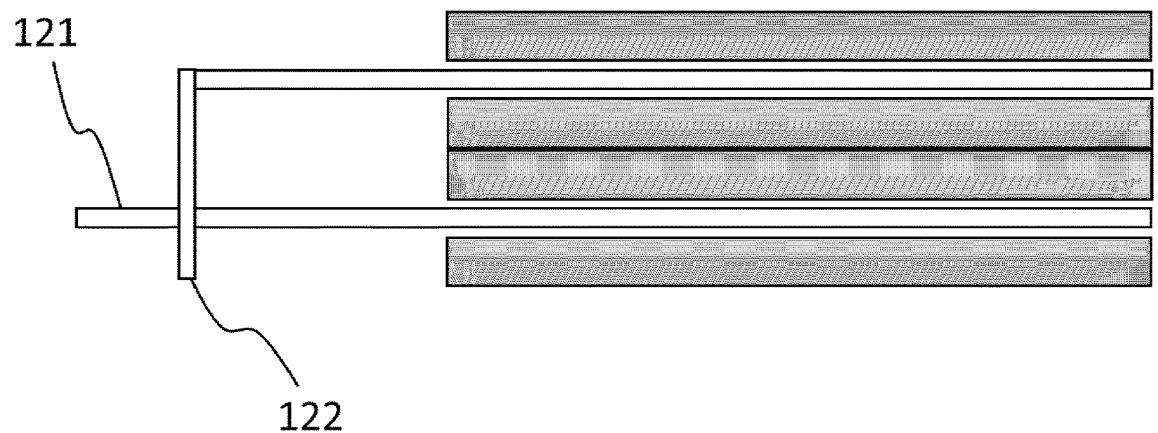

[FIG. 14A]
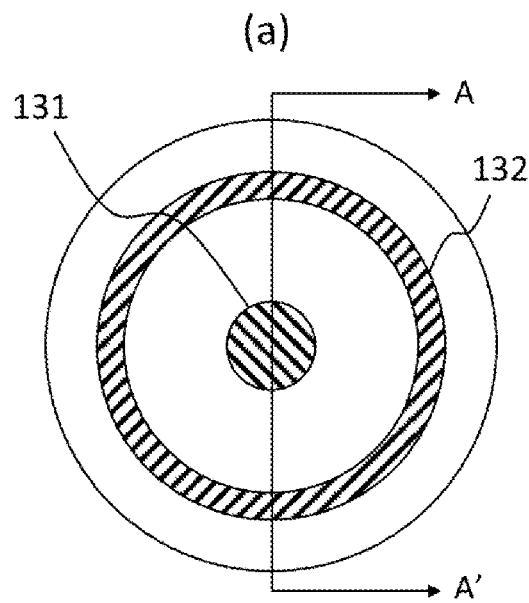
[FIG. 14B]
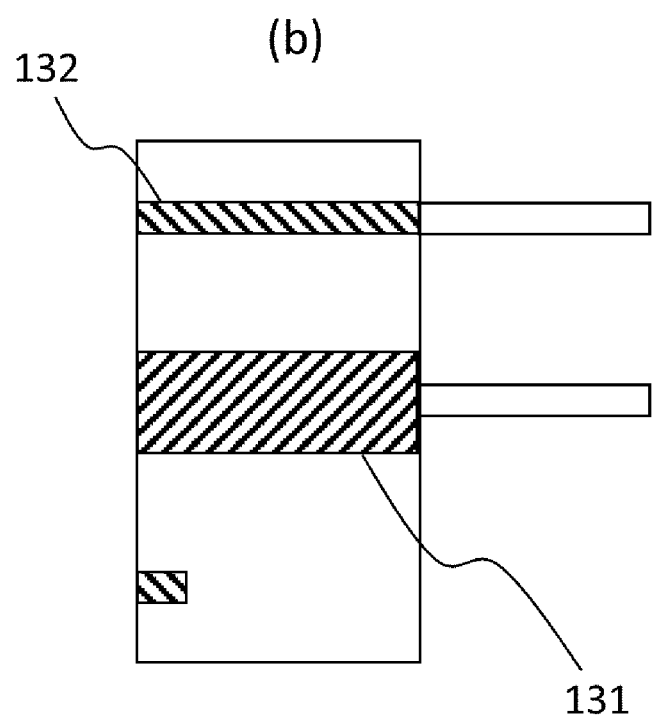

[FIG. 15A]
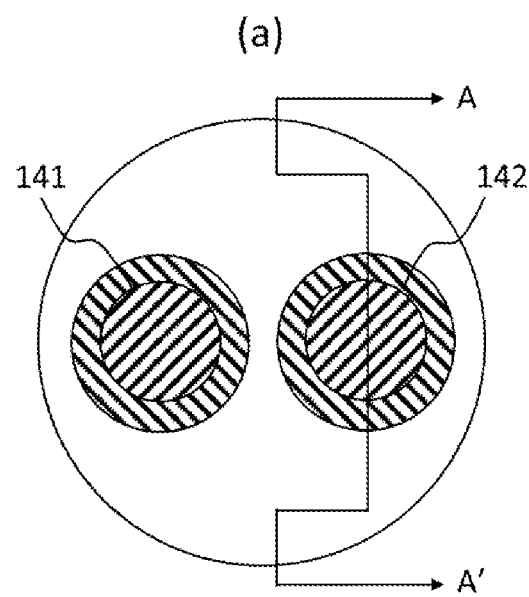
[FIG. 15B]
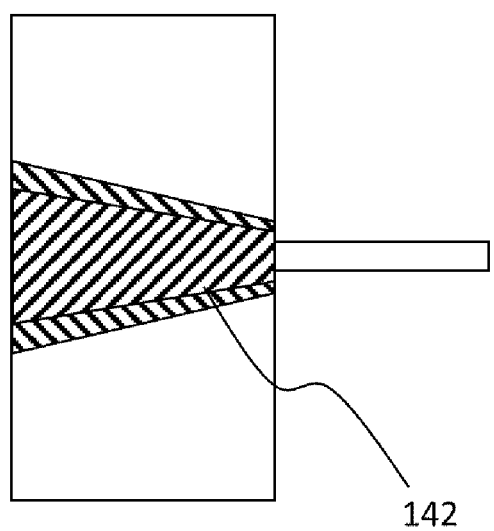

[FIG. 16A]
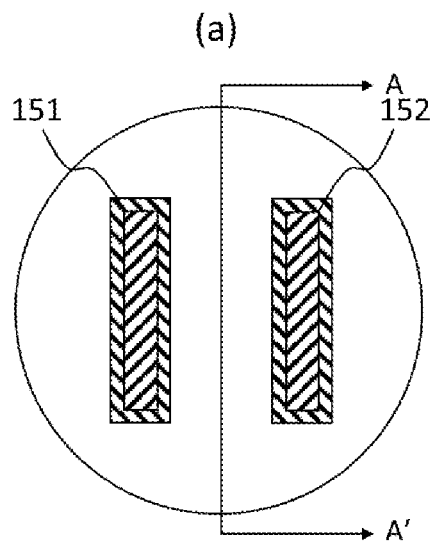
[FIG. 16B]
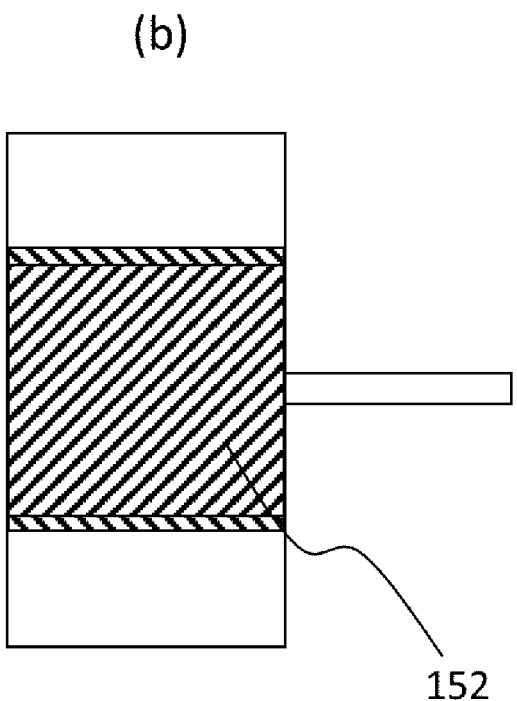

[FIG. 17]
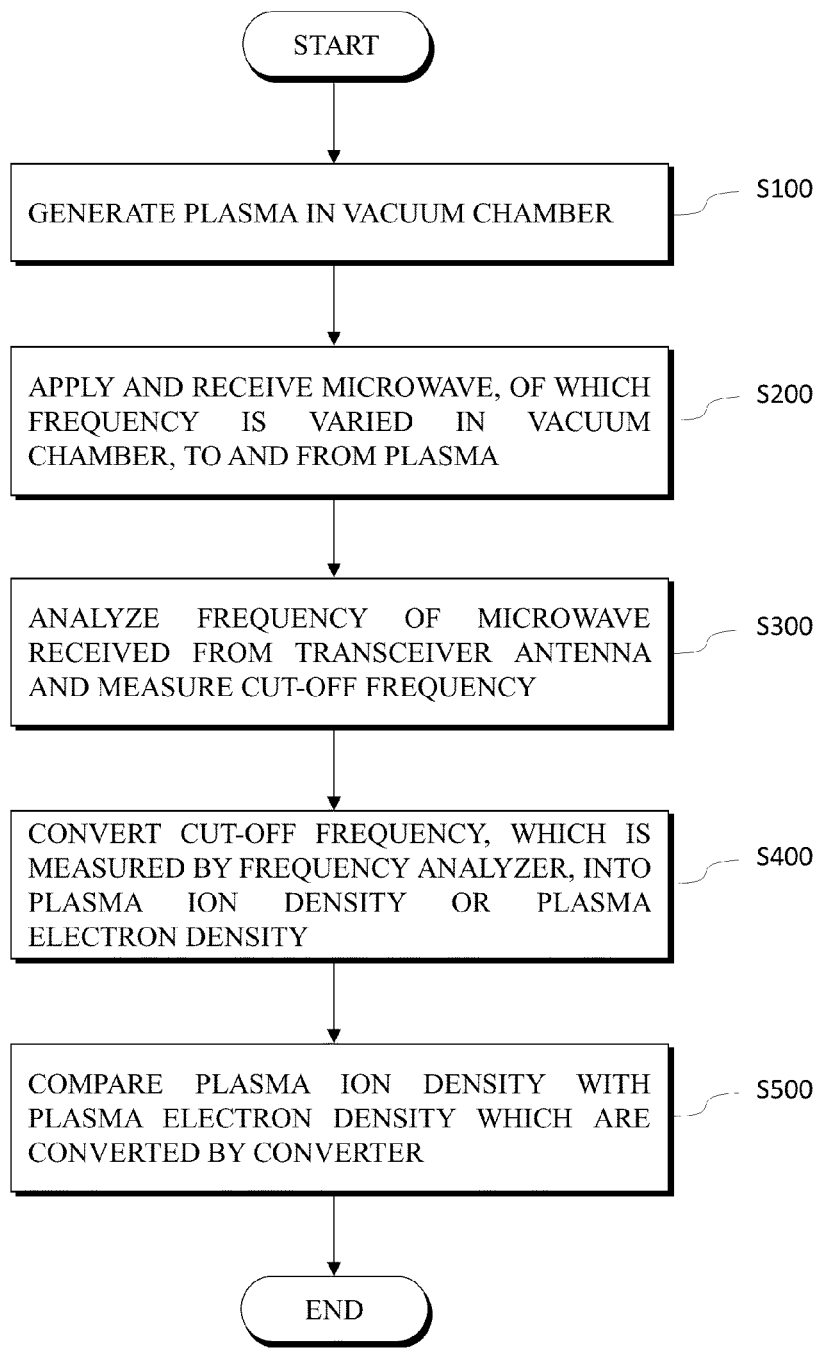

DEVICE FOR MEASURING PLASMA ION DENSITY AND APPARATUS FOR DIAGNOSING PLASMA USING THE SAME

CROSS-REFERENCE TO RELATED APPLICATION

This application claims priority to and the benefit of Korean Patent Application No. 10-2021-0022899 filed on Feb. 19, 2021, the disclosure of which is incorporated herein by reference in its entirety.

BACKGROUND

1. Field of the Invention

The present invention relates to a device for measuring a plasma ion density and an apparatus for diagnosing plasma using the same, and more particularly, to a device for measuring a plasma ion density, which is capable of obtaining a plasma ion density from an ion plasma cut-off frequency measured by a microwave frequency transceiver antenna and obtaining a plasma density from the plasma ion density.

The present invention relates to research which was carried out under the support of a material innovation program (1711120490/2020M3H4A3106004 and 51% contribution) of the National Research Foundation of Korea (NRF) receiving research funding from the Ministry of Science and ICT, a research and development (R&D) convergence program (1711062007/CAP-17-02-NFRI-01) of the National Research Council of Science & Technology (NST), a future-leading convergence research project (CRC-20-01-NFRI), and the Korea Research Institute of Standards and Science (KRISS).

2. Discussion of Related Art

As the application fields of plasma expand in various ways, the importance of plasma diagnosis technology is increasing. In the case of a Langmuir probe which is commonly used, an electron density and an ion density of plasma can be measured from an I-V characteristic of a current I according to an applied voltage V. However, there are problems in that measurement accuracy is lowered, a high voltage applied to the Langmuir probe may change plasma, and plasma measurement is difficult due to etching or deposition of the Langmuir probe in a process gas environment.

In order to solve such problems of the Langmuir probe and use a correlation between a density and a natural frequency of plasma, when an electromagnetic wave corresponding to the natural frequency of the plasma is applied to the plasma in a chamber, a technique for measuring and monitoring the density of the plasma by scanning a frequency range to be cut-off has been developed. In the technique, the frequency of the plasma is analyzed on the basis of the electron density in the plasma.

Plasma is an electrically neutral ionized gas. In the plasma, negative (−) particles and positive (+) particles exist at the same density, and since most of the negative (−) particles are electrons, it can be regarded that an electron density is substantially equal to an ion density of the positive (+) particles.

However, since electrons have one type of particle whereas positive (+) ions have various types of particles, it is necessary to understand movement of the positive (+) ions acting as a major factor in an actual thin film deposition process and an actual etching process.

Eventually, according to a variation in plasma density, external variables such as power applied to a plasma chamber and the like should be adjusted. However, according to the related art, since a variation in plasma density is obtained by analyzing only a plasma frequency on the basis of the electron density, it is impossible to accurately control the ion density in the actual thin film deposition process.

Korean Registered Patent No. 10-0473794 relates to a plasma electron density measuring and monitoring device having a frequency probe in an antenna structure, which is equipped with a transceiver antenna having a probe in the form of a rod and a frequency probe is inserted into plasma to measure an electron density in the plasma. However, since an ion density in the plasma cannot be measured, there is a problem in that the ion density cannot be accurately controlled in a thin film deposition process.

Korean Registered Patent No. 10-0805879 relates to a plasma electron density and electron temperature monitoring device and a method thereof, which monitor an electron density and an electron temperature in plasma. However, since the ion density in the plasma cannot be measured, there is a problem in that the ion density cannot be accurately controlled in a thin film etching process and a deposition process.

Korean Registered Patent No. 10-1225010 relates to a microwave probe having a radiation antenna in the form of a rod and a receiving antenna in the form of a loop, in which the radiation antenna in the form of a rod and the receiving antenna in the form of a loop are provided, and the receiving antenna is formed in the form of a loop to increase a reception rate. However, since an ion density in plasma cannot be measured, there is a problem in that the ion density cannot be accurately controlled in a thin film etching process and a deposition process.

Korean Patent Laid-Open Application No. 10-2017-0069652 relates to a microwave plasma diagnostic apparatus of a planar ring-type, in which a transmitting antenna and a receiving antenna are disposed in a coaxial structure so as to detect a cut-off frequency of plasma and measure a plasma density, and the receiving antenna is formed in the form of a ring to surround the transmitting antenna. However, since the microwave plasma diagnostic apparatus of a planar ring-type cannot measure an ion density in plasma, there is a problem in that the ion density cannot be accurately controlled in a thin film etching process and a deposition process.

Korean Registered Patent No. 10-1756325 relates to a planar type plasma diagnosis apparatus in which each of a transmitting antenna and a receiving antenna is formed in a planar cone-type so as to detect a cut-off frequency of plasma to measure a plasma density. However, since a planar cone-type cut-off probe cannot measure an ion density in the plasma, there is a problem in that the ion density cannot be accurately controlled in a thin film etching process and a deposition process.

RELATED ART DOCUMENT

Patent Document (Patent Document 1) Korean Registered Patent No. 10-0473794
(Patent Document 2) Korean Registered Patent No. 10-0805879
(Patent Document 3) Korean Registered Patent No. 10-1225010
(Patent Document 4) Korean Patent Laid-Open Application No. 10-2017-0069652
(Patent Document 5) Korean Registered Patent No. 10-1756325

SUMMARY OF THE INVENTION

The present invention is directed to measuring an ion density in plasma.

The present invention is also directed to measuring the ion density in the plasma and accurately measuring a plasma density.

The present invention is also directed to measuring the ion density in the plasma and comparing the ion density with an electron density, thereby accurately controlling the ion density in a thin film etching process and a deposition process.

The problems to be solved by the present invention are not limited to the above objects, and other technical problems not explicitly indicated above can be easily understood by those skilled in the art through the following configuration and operations of the present invention.

The present invention includes the following configurations so as to solve the above objects.

According to an aspect of the present invention, there is provided a device for measuring a plasma ion density, which includes a transceiver antenna configured to apply and receive a microwave, of which a frequency is varied, to and from plasma, and a frequency analyzer configured to analyze a frequency of the microwave received from the transceiver antenna and measure a cut-off frequency, wherein the frequency of the microwave applied to the plasma is varied in the range of 100 kHz to 500 MHz.

The device may further include a converter configured to convert the cut-off frequency, which is measured by the frequency analyzer, into a plasma ion density.

The transceiver antenna may be a probe-type antenna.
The transceiver antenna may be a loop-type antenna.
The transceiver antenna may be a planar ring-type antenna.
The transceiver antenna may be a planar cone-type antenna.
The transceiver antenna may be a planar bar-type antenna.

According to another aspect of the present invention, there is provided a device for measuring a plasma ion density, which includes a transceiver antenna configured to apply and receive a microwave, of which a frequency is varied, to and from plasma, and a frequency analyzer configured to analyze a frequency of the microwave received from the transceiver antenna and measure a cut-off frequency, wherein the frequency of the microwave applied to the plasma is varied in the range of 100 kHz to 500 MHz.

The device may further include a converter configured to convert the cut-off frequency, which is measured by the frequency analyzer, into a plasma ion density.

The transceiver antenna may be a probe-type antenna.
The transceiver antenna may be a loop-type antenna.
The transceiver antenna may be a planar ring-type antenna.
The transceiver antenna may be a planar cone-type antenna.
The transceiver antenna may be a planar bar-type antenna.

According to still another aspect of the present invention, there is provided an apparatus for diagnosing plasma, which includes a transceiver antenna configured to apply and receive a microwave, of which a frequency is varied, to and from plasma, and a frequency analyzer configured to analyze a frequency of the microwave received from the transceiver antenna and measure a cut-off frequency, a converter configured to convert the cut-off frequency, which is measured by the frequency analyzer, into a plasma electron density or a plasma ion density, and a comparator configured to compare the plasma electron density with the plasma ion density, which are converted by the converter.

The frequency of the microwave applied to the plasma may be varied in a range of 100 kHz to 500 MHz and in a range of 0.5 GHz to 10 GHz.

According to yet another aspect of the present invention, there is provided a plasma process device including a vacuum chamber configured to generate plasma, a transceiver antenna configured to apply and receive a microwave, of which a frequency is varied in the vacuum chamber, to and from the plasma, a frequency analyzer configured to analyze a frequency of the microwave received from the transceiver antenna and measure a cut-off frequency, a converter configured to convert the cut-off frequency, which is measured by the frequency analyzer, into a plasma ion density or a plasma electron density, and a comparator configured to compare the plasma ion density with the plasma electron density, which are converted by the converter.

According to yet another aspect of the present invention, there is provided a method of diagnosing plasma, which includes generating plasma in a vacuum chamber, applying and receiving a microwave, of which a frequency is varied in the vacuum chamber, to and from the plasma, analyzing a frequency of the microwave received from the transceiver antenna and measuring a cut-off frequency, converting the cut-off frequency, which is measured by a frequency analyzer, into a plasma ion density or a plasma electron density, and comparing the plasma ion density with the plasma electron density, which are converted by a converter.

According to yet another aspect of the present invention, there is provided a method of processing plasma, which includes generating plasma in a vacuum chamber, applying and receiving a microwave, of which a frequency is varied in the vacuum chamber, to and from the plasma, analyzing a frequency of the microwave received from the transceiver antenna and measuring a cut-off frequency, converting the cut-off frequency, which is measured by a frequency analyzer, into a plasma ion density or a plasma electron density, and comparing the plasma ion density with the plasma electron density, which are converted by a converter, and controlling at least one of power being supplied from a power supply, a gas flow rate, and a discharge pressure for plasma generation according to a difference between the plasma ion density and the plasma electron density which are compared by a comparator.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which:

FIG. 1 is a schematic block diagram for measuring pollutant particles in a vacuum chamber and measuring a plasma frequency in order to control a plasma process;

FIG. 2 is a diagram illustrating a laser optical system for measuring pollutant particles when the block diagram of FIG. 1 is viewed from above;

FIG. 3 is a detailed block diagram for measuring a plasma frequency in a vacuum chamber according to the present invention;

FIG. 4A is a graph showing an ion plasma frequency spectrum of a transmission coefficient in a vacuum chamber in which plasma is generated, and FIG. 4B is a graph showing an electron plasma frequency spectrum of the transmission coefficient in the vacuum chamber in which the plasma is generated;

FIG. 5A is a graph showing an ion plasma frequency spectrum of a transmission coefficient in a vacuum chamber in which plasma is generated due to He gas while an applied power is varied, and FIG. 5B is a graph showing an electron plasma frequency spectrum of the transmission coefficient in the vacuum chamber in which the plasma is generated due to He gas while the applied power is varied;

FIG. 6A is a graph showing a comparison of a theoretical value and an actually measured value of an ion plasma frequency with respect to an electron plasma frequency in the vacuum chamber in which the plasma is generated due to He gas, and FIG. 6B is a graph showing a comparison of a theoretical value and an actually measured value of a plasma ion density with respect to a plasma electron density in the vacuum chamber in which the plasma is generated due to He gas;

FIG. 7A is a graph showing an ion plasma frequency spectrum of a transmission coefficient in a vacuum chamber in which plasma is generated due to Ne gas while an applied power is varied, and FIG. 7B is a graph showing an electron plasma frequency spectrum of the transmission coefficient in the vacuum chamber in which the plasma is generated due to Ne gas while the applied power is varied;

FIG. 8A is a graph showing a comparison of a theoretical value and an actually measured value of an ion plasma frequency with respect to an electron plasma frequency in the vacuum chamber in which the plasma is generated due to Ne gas, and FIG. 8B is a graph showing a comparison of a theoretical value and an actually measured value of a plasma ion density with respect to a plasma electron density in the vacuum chamber in which the plasma is generated due to Ne gas;

FIG. 9A is a graph showing an ion plasma frequency spectrum of a transmission coefficient in a vacuum chamber in which plasma is generated due to Ar gas while an applied power is varied, and FIG. 9B is a graph showing an electron plasma frequency spectrum of the transmission coefficient in the vacuum chamber in which the plasma is generated due to Ar gas while the applied power is varied;

FIG. 10A is a graph showing a comparison of a theoretical value and an actually measured value of an ion plasma frequency with respect to an electron plasma frequency in the vacuum chamber in which the plasma is generated due to Ar gas, and FIG. 10B is a graph showing a comparison of a theoretical value and an actually measured value of a plasma ion density with respect to a plasma electron density in the vacuum chamber in which the plasma is generated due to Ar gas;

FIG. 11A is a graph showing a comparison of a theoretical value and an actually measured value of a frequency of each of an Ar ion and a He ion of plasma with respect to an electron plasma frequency according to a ratio of the He ion in a mixed gas in a vacuum chamber in which the plasma is generated due to the mixed gas of He and Ar, and FIG. 11B is a graph showing variations in He ion density, Ar ion density, and electron density according to the ratio of the He ion in the mixed gas in the vacuum chamber in which the plasma is generated due to the mixed gas of He and Ar;

FIG. 12A and FIG. 12B are a diagram illustrating a specific shape of a transceiver antenna with a probe in the form of a rod;

FIG. 13A and FIG. 13B are a diagram illustrating specific shapes of a radiation antenna in the form of a rod and a receiving antenna in the form of a loop;

FIG. 14A and FIG. 14B are a diagram illustrating a specific shape of a planar ring-type apparatus for diagnosing plasma;

FIG. 15A and FIG. 15B are a diagram illustrating a specific shape of a planar cone-type apparatus for diagnosing plasma;

FIG. 16A and FIG. 16B are a diagram illustrating a specific shape of a planar bar-type apparatus for diagnosing plasma; and FIG. 17 is a flowchart illustrating a method of diagnosing plasma using a device for measuring a plasma ion according to the present invention.

DETAILED DESCRIPTION OF EXEMPLARY EMBODIMENTS

Hereinafter, an overall configuration and operation according to exemplary embodiments of the present invention will be described. These embodiments are illustrative and do not limit the configuration and operation of the present invention, and other configurations and operations that are not explicitly shown in the embodiments can be regarded as the technical spirit of the present invention when those skilled in the art can easily understand through the following embodiments of the present invention.

FIG. 1 is a schematic block diagram for measuring pollutant particles in a vacuum chamber and measuring a plasma frequency in order to control a plasma process.

Referring to FIG. 1, in order to control the plasma process in a vacuum chamber, pollutant particles are measured and a plasma frequency is measured. The measurement of the pollutant particles may be performed by a laser optical system including a laser beam source 80 and detectors 81, 82, and 83, an optical emission spectroscopy (OES) 85, and a pollutant particle collector 87.

The OES 85 may be used not only to detect plasma and active species in the plasma but also to detect pollutant particles. In the laser optical system, a laser generated from the laser beam source 80 passes through plasma in the vacuum chamber through a window on a wall surface of the vacuum chamber and the detectors 81, 82, and 83 detect the laser, and thus pollutant particles in the plasma may be measured from the detected result.

In addition, in order to measure a plasma frequency, transceiver antennas 10 and 11, a network signal analyzer or frequency analyzer 20, a switching circuit 21, a vacuum chamber 30, a power supply 40, a matching circuit 50, a substrate 60, and a substrate support 70 are provided.

A variety of types of the transceiver antennas 10 and 11 may be used, and the planar-type transceiver antenna 11 may be embedded in a wall surface of the vacuum chamber 30 or embedded in the substrate support 70.

The switching circuit 21 may be provided between the time division network signal analyzer or frequency analyzer 20 and the plurality of transceiver antennas 10 and 11, and a time difference between signals, which are transmitted and received between the time division network signal analyzer or frequency analyzer 20 and the plurality of transceiver antennas 10 and 11 by a switching operation of the switching circuit 21, may be discriminated so that it is possible to operate each of the transceiver antennas 10 and 11.

FIG. 2 is a diagram illustrating a laser optical system for measuring pollutant particles when the block diagram of FIG. 1 is viewed from above.

Referring to FIG. 2, a laser beam generated from the laser beam source 80 passes through plasma generated in the vacuum chamber 30 through a window on the wall surface of the vacuum chamber 30. When the laser beam passes through the plasma, due to the pollutant particles in the plasma, an intensity of the laser beam may be attenuated or the laser beam may be scattered.

When the intensity of the laser beam is attenuated, the detector 81 may detect the attenuation, and it may be determined that the number of the pollutant particles is increased. When the laser beam is scattered, the detector 82 detects scattering of the laser beam according to a scattering angle to determine a size of the pollutant particle.

In addition, when the scattering of the laser beam is detected in the detector 83, a size of the pollutant particle may be determined according to a scattering angle of the laser beam. According to a degree of symmetry between the sizes of the pollutant particles determined by the detector 82 and the detector 83, it is possible to determine whether a shape of the pollutant particle is spherical or non-spherical.

FIG. 3 is a detailed block diagram for measuring a plasma frequency in a vacuum chamber according to the present invention.

Referring to FIG. 3, according to the present invention, in order to measure the plasma frequency in the vacuum chamber, the transceiver antenna 10, the frequency analyzer 20, the vacuum chamber 30, the power supply 40, a power controller 41, the matching circuit 50, the substrate 60, and the substrate support 70 are provided.

The transceiver antenna 10 may apply and receive a microwave with a variable frequency to and from the plasma, and a position of the transceiver antenna 10 may be moved in the vacuum chamber 30.

The transceiver antenna 10 may be formed in various shapes such as a transceiver antenna with a probe in the form of a rod, a radiation antenna in the form of a rod and a receiving antenna in the form of a loop, a planar ring-type apparatus for diagnosing plasma, a planar cone-type apparatus for diagnosing plasma, and a planar bar-type apparatus for diagnosing plasma, a planar ring-type apparatus for diagnosing plasma, a planar cone-type apparatus for diagnosing plasma, and a planar bar-type apparatus for diagnosing plasma may be formed to be embedded in the wall surface of the vacuum chamber 30 or the substrate support 70.

The frequency analyzer 20 may be connected to the transceiver antenna 10 to vary a frequency of a microwave, which is applied to plasma, and analyze a frequency of a received microwave.

The power supply 40 may supply high-frequency power so as to generate plasma by ionizing a gas supplied into the vacuum chamber 30, and the matching circuit 50 may be a component for impedance matching and may be formed to minimize reflection loss.

In a semiconductor process, the substrate support 70 is provided in the vacuum chamber 30 for deposition or etching, the substrate 60 such as a semiconductor wafer or a display substrate is located on the substrate support 70, and when a gas for generating plasma is injected into the vacuum chamber 30, the gas is ionized to generate plasma due to power supplied from the power supply 40.

Ions and electrons are included in the plasma, and deposition or etching may be accurately performed by controlling movement of the ions and the electrons in the plasma. A variation in plasma density is measured and the power supplied from the power supply 40 is adjusted so that the deposition or etching may be performed more accurately.

The plasma is an ionized neutral gas, and thus ions and electrons can be regarded as existing at substantially the same density. Unlike the electrons which are a single type of particle, the ions are various types as well as positive (+) ions and negative (−) ions. When a mixed gas is injected into the vacuum chamber 30, various types of positive (+) ions and negative (−) ions may exist.

According to the related art, an electron density is calculated by measuring only an electron plasma frequency, a plasma density is calculated from the calculated electron density, and the power supplied from the power supply 40 is adjusted to perform a semiconductor process. However, in this case, as described above, it is impossible to accurately control movement of various types of ions existing in the plasma.

FIG. 4A is a graph showing an ion plasma frequency spectrum of a transmission coefficient in a vacuum chamber in which plasma is generated, and FIG. 4B is a graph showing an electron plasma frequency spectrum of the transmission coefficient in the vacuum chamber in which the plasma is generated.

Referring to FIG. 4A, when the plasma is generated by injecting Ar gas into the vacuum chamber 30, the frequency analyzer 20 varies a frequency of a microwave applied to the plasma through the transceiver antenna 10 and analyzes a frequency of a received microwave to show an ion plasma frequency spectrum of a transmission coefficient.

A frequency band of the microwave may be varied in the range of 100 kHz to 500 MHz, and more preferably, in the range of 400 kHz to 100 MHz, and the microwave is cut off at a frequency of 2.51 MHz. The cut-off frequency corresponds to an ion plasma frequency that is a natural frequency.

The ion plasma frequency $f_{pi}$ may be expressed by the following Equation 1 and an ion density may be calculated from Equation help 1.

$$f_{pi} = \sqrt{\frac{e^2 n_i}{\epsilon_0 M_i}} \qquad \text{[Equation 1]}$$

Here, e is an elementary quantum of electricity, $n_i$ is the ion density (cm$^{-3}$), $\epsilon_0$ is a dielectric constant in a vacuum, and $M_i$ is ion mass.

Referring to FIG. 4B, when the plasma is generated by injecting Ar gas into the vacuum chamber 30, the frequency analyzer 20 varies a frequency of a microwave applied to the plasma through the transceiver antenna 10 and analyzes a frequency of a received microwave to show an electron plasma frequency spectrum of the transmission coefficient.

The frequency band of the microwave may be varied in the range of 0.5 GHz to 2 GHz, and the microwave is cut off at a frequency of 0.69 GHz. The cut-off frequency corresponds to an electron plasma frequency that is a natural frequency.

The electron plasma frequency may be expressed by the following Equation 2, and an electron density may be calculated from Equation 2.

$$f_{pe} = \sqrt{\frac{e^2 n_e}{\epsilon_0 m_e}} \qquad \text{[Equation 2]}$$

Here, e is an elementary quantum of electricity, $n_e$ is the electron density (cm$^{-3}$), $\epsilon_0$ is a dielectric constant in a vacuum, and $m_e$ is electron mass.

Since the ion density $n_i$ and the electron density $n_e$ are equal to each other in the plasma, a theoretical value of the ion plasma frequency $f_{pi}$ may be expressed with respect to the electron plasma frequency $f_{pe}$ by the following Equation 3.

$$f_{pi} = \sqrt{\frac{e^2 n_i}{\epsilon_0 M_i}} = f_{pe} \times \sqrt{\frac{m_e}{M_i}} \qquad \text{[Equation 3]}$$

FIG. 5A is a graph showing an ion plasma frequency spectrum of a transmission coefficient in a vacuum chamber in which plasma is generated due to He gas while an applied power is varied, and FIG. 5B is a graph showing an electron plasma frequency spectrum of the transmission coefficient in the vacuum chamber in which the plasma is generated due to He gas while the applied power is varied.

Referring to FIG. 5A, when the plasma is generated by injecting He gas into the vacuum chamber 30, the frequency analyzer 20 varies a frequency of a microwave applied to the plasma through the transceiver antenna 10 and analyzes a frequency of a received microwave to show an ion plasma frequency spectrum of a transmission coefficient.

The frequency band of the microwave is varied in the range of 0 MHz to 10 MHz, and as the power applied from the power supply 40 for plasma generation is increased, the ion plasma frequency $f_{pi}$ is in creased.

Referring to FIG. 5B, when the plasma is generated by injecting He gas into the vacuum chamber 30, the frequency analyzer 20 varies a frequency of a microwave applied to the plasma through the transceiver antenna 10 and analyzes a frequency of a received microwave to show an electron plasma frequency spectrum of the transmission coefficient.

The frequency band of the microwave is varied in the range of 0 MHz to 0.4 GHz and, as the power applied from the power supply 40 for plasma generation is increased, the electron plasma frequency $f_{pe}$ is increased.

FIG. FIG. 6A is a graph showing a comparison of a theoretical value and an actually measured value of an ion plasma frequency with respect to an electron plasma frequency in the vacuum chamber in which the plasma is generated due to He gas, and FIG. 6B is a graph showing a comparison of a theoretical value and an actually measured value of a plasma ion density with respect to a plasma electron density in the vacuum chamber in which the plasma is generated due to He gas.

Referring to FIG. 6A, when plasma is generated by injecting He gas into the vacuum chamber 30, the ion plasma frequency and the electron plasma frequency are measured, a theoretical value of the ion plasma frequency with respect to the electron plasma frequency is compared to an actually measured value of the ion plasma frequency, and the comparison result is shown as a graph.

As expressed by Equation 3, the theoretical value of the ion plasma frequency is shown as a linear line in the graph, which has a slope of the square root of a mass ratio with a relationship proportional to the electron plasma frequency, and the actually measured value of the ion plasma frequency is also measured in the range in which a difference is maximally within 4.42% when compared to the theoretical value of the ion plasma frequency.

Referring to FIG. 6B, when the plasma ion density is compared to the electron density, an ion density converted from the theoretical value of the ion plasma frequency is also measured in the range in which a difference is maximally within 8.64% when compared to an ion density converted from the measured value of the ion plasma frequency.

As described above, when a density of the plasma generated from only He gas is measured, it can be seen that accurate measurement is possible in both the case of using the electron density and the case of using the ion density.

FIG. 7A is a graph showing an ion plasma frequency spectrum of a transmission coefficient in a vacuum chamber in which plasma is generated due to Ne gas while an applied power is varied, and FIG. 7B is a graph showing an electron plasma frequency spectrum of the transmission coefficient in the vacuum chamber in which the plasma is generated due to Ne gas while the applied power is varied.

Referring to FIG. 7A, when the plasma is generated by injecting Ne gas into the vacuum chamber 30, the frequency analyzer 20 varies a frequency of a microwave applied to the plasma through the transceiver antenna 10 and analyzes a frequency of a received microwave to show an ion plasma frequency spectrum of a transmission coefficient.

The frequency band of the microwave is varied in the range of 0 MHz to 10 MHz and, as the power applied from the power supply 40 for plasma generation is increased, the ion plasma frequency $f_{pi}$ is increased.

Referring to FIG. 7B, when the plasma is generated by injecting Ne gas into the vacuum chamber 30, the frequency analyzer 20 varies a frequency of a microwave applied to the plasma through the transceiver antenna 10 and analyzes a frequency of a received microwave to show an electron plasma frequency spectrum of the transmission coefficient.

The frequency band of the microwave is varied in the range of 0 MHz to 2 GHz and, as the power applied from the power supply 40 for plasma generation is increased, the electron plasma frequency $f_{pe}$ is increased.

FIG. 8A is a graph showing a comparison of a theoretical value and an actually measured value of an ion plasma frequency with respect to an electron plasma frequency in the vacuum chamber in which the plasma is generated due to Ne gas, and FIG. 8B is a graph showing a comparison of a theoretical value and an actually measured value of a plasma ion density with respect to a plasma electron density in the vacuum chamber in which the plasma is generated due to Ne gas.

Referring to FIG. 8A, when plasma is generated by injecting Ne gas into the vacuum chamber 30, the ion plasma frequency and the electron plasma frequency are measured, a theoretical value of the ion plasma frequency with respect to the electron plasma frequency is compared to an actually measured value of the ion plasma frequency, and the comparison result is shown as a graph.

As expressed by Equation 3, the theoretical value of the ion plasma frequency is shown as a linear line in the graph, which has a slope of the square root of a mass ratio with a relationship proportional to the electron plasma frequency, and the actually measured value of the ion plasma frequency is also measured in the range in which a difference is maximally within 3.97% when compared to the theoretical value of the ion plasma frequency.

Referring to FIG. 8B, when the plasma ion density is compared to the electron density, an ion density converted from the theoretical value of the ion plasma frequency is also measured in the range in which a difference is maximally within 8.09% when compared to an ion density converted from the measured value of the ion plasma frequency.

As described above, when a density of the plasma generated from only Ne gas is measured, it can be seen that accurate measurement is possible in both the case of using the electron density and the case of using the ion density.

FIG. 9A is a graph showing an ion plasma frequency spectrum of a transmission coefficient in a vacuum chamber in which plasma is generated due to Ar gas while an applied power is varied, and FIG. 9B is a graph showing an electron plasma frequency spectrum of the transmission coefficient in the vacuum chamber in which the plasma is generated due to Ar gas while the applied power is varied;

Referring to FIG. 9A, when the plasma is generated by injecting Ar gas into the vacuum chamber 30, the frequency analyzer 20 varies a frequency of a microwave applied to the plasma through the transceiver antenna 10 and analyzes a frequency of a received microwave to show an ion plasma frequency spectrum of a transmission coefficient.

The frequency band of the microwave is varied in the range of 0 MHz to 10 MHz and, as the power applied from the power supply 40 for plasma generation is increased, the ion plasma frequency $f_{pi}$ is increased.

Referring to FIG. 9B, when the plasma is generated by injecting Ar gas into the vacuum chamber 30, the frequency analyzer 20 varies a frequency of a microwave applied to the plasma through the transceiver antenna 10 and analyzes a frequency of a received microwave to show an electron plasma frequency spectrum of the transmission coefficient.

The frequency band of the microwave is varied in the range of 0 MHz to 2 GHz and, as the power applied from the power supply 40 for plasma generation is increased, the electron plasma frequency $f_{pe}$ is increased.

FIG. 10A is a graph showing a comparison of a theoretical value and an actually measured value of an ion plasma frequency with respect to an electron plasma frequency in the vacuum chamber in which the plasma is generated due to Ar gas, and FIG. 10B is a graph showing a comparison of a theoretical value and an actually measured value of a plasma ion density with respect to a plasma electron density in the vacuum chamber in which the plasma is generated due to Ar gas.

Referring to FIG. 10A, when plasma is generated by injecting Ar gas into the vacuum chamber 30, the ion plasma frequency and the electron plasma frequency are measured, a theoretical value of the ion plasma frequency with respect to the electron plasma frequency is compared to an actually measured value of the ion plasma frequency, and the comparison result is shown as a graph.

As expressed by Equation 3, the theoretical value of the ion plasma frequency is shown as a linear line in the graph, which has a slope of the square root of a mass ratio with a relationship proportional to the electron plasma frequency, and the actually measured value of the ion plasma frequency is also measured in the range in which a difference is maximally within 2.15% when compared to the theoretical value of the ion plasma frequency.

Referring to FIG. 10B, when the plasma ion density is compared to the electron density, an ion density converted from the theoretical value of the ion plasma frequency is also measured in the range in which a difference is maximally within 4.33% when compared to an ion density converted from the measured value of the ion plasma frequency.

As described above, when a density of the plasma generated from only Ar gas is measured, it can be seen that accurate measurement is possible in both the case of using the electron density and the case of using the ion density.

FIG. 11A is a graph showing a comparison of a theoretical value and an actually measured value of a frequency of each of an Ar ion and a He ion of plasma with respect to an electron plasma frequency according to a ratio of the He ion in a mixed gas in a vacuum chamber in which the plasma is generated due to the mixed gas of He and Ar, and FIG. 11B is a graph showing variations in He ion density, Ar ion density, and electron density according to the ratio of the He ion in the mixed gas in the vacuum chamber in which the plasma is generated due to the mixed gas of He and Ar;

Referring to FIG. 11A, when plasma is generated by injecting a mixed gas of He and Ar into the vacuum chamber 30, the ion plasma frequency and the electron plasma frequency are measured according to a ratio of the He ion in the mixed gas, a theoretical value of the ion plasma frequency of each of the He ion and the Ar ion with respect to the electron plasma frequency is compared to an actually measured value of the ion plasma frequency, and the comparison result is shown as a graph.

As expressed by Equation 3, a theoretical value of a He ion plasma frequency and a theoretical value of the Ar ion plasma frequency are proportional to the electron plasma frequency $f_{pe}$, and a case in which only He gas is injected and a case in which only Ar gas is injected are indicated by a dotted line and a linear line in the graph, respectively. When the mixed gas is injected, an actually measured value $f_{pi}$ of the actual ion plasma frequency is shown as one measured value.

When the mixed gas is injected, the behavior of several ions is measured as one ion plasma frequency.

As shown in the graphs, the actually measured value $f_{pi}$ of the ion plasma frequency represents a large difference from the theoretical value of the He ion plasma frequency and, when the ratio of the He gas in the mixed gas is low, the actually measured value $f_{pi}$ of the ion plasma frequency is equal to the theoretical value of an Ar ion plasma frequency. However, as the ratio of the He gas in the mixed gas is increased, the actually measured value $f_{pi}$ of the ion plasma frequency shows a difference from the theoretical value of the Ar ion plasma frequency.

That is, since the theoretical value of the Ar ion plasma frequency is calculated from the electron plasma frequency, it can be seen that a variation in ion density in the plasma cannot be accurately measured by measuring only the electron plasma frequency.

Meanwhile, as described above, the theoretical value of the He ion plasma frequency is calculated from the electron plasma frequency $f_{pe}$ when only He gas is injected into the vacuum chamber 30, and the theoretical value of the Ar ion plasma frequency is calculated from the electron plasma frequency $f_{pe}$ when only Ar gas is injected into the vacuum chamber 30. Thus, when the mixed gas is injected into the vacuum chamber 30, the He ion plasma frequency, the Ar ion plasma frequency, a He ion concentration, and an Ar ion concentration are calculated and compared below.

Referring to FIG. 11B, when the ratio of He in the mixed gas is small, the electron density and the Ar ion density in the mixed gas are substantially the same as each other. However, as the ratio of He in the mixed gas is increased, a difference between the electron density and the Ar ion density in the mixed gas is exhibited.

For reference, the difference is exhibited to be a very small in the graph. However, since a vertical axis of the graph is a log value, the difference is actually a very large difference, and the reason that the vertical axis is the log value is that the He ion density is too small and thus is shown in one graph.

Meanwhile, the He ion density and the Ar ion density are values calculated from the following equations.

$$\omega_{pi,total} = \sqrt{\omega_{pi,He}^2 + \omega_{pi,Ar}^2}$$ [Equation 4]

$$\omega_{pi,He} = \sqrt{\frac{e^2 n_{He}}{\epsilon_0 M_{He}}}$$ [Equation 5]

$$\omega_{pi,Ar} = \sqrt{\frac{e^2 n_{Ar}}{\epsilon_0 M_{Ar}}} = \sqrt{\frac{e^2 (n_e - n_{He})}{\epsilon_0 M_{Ar}}}$$ [Equation 6]

$$n_e = n_{He} + n_{Ar}$$ [Equation 7]

As described above, when a mixed gas is injected, since only one ion plasma frequency is measured with respect to the behavior of the entire ions, Equation 4 is derived by estimating that the one ion plasma frequency is measured from a center of mass motion of He ions and Ar ions.

Like Equation 1, Equation 5 is an equation representing the He ion plasma frequency as the He ion density, and Equation 6 is an equation representing the Ar ion plasma frequency as the Ar ion density. In addition, in Equation 6, the Ar ion density is expressed as the He ion density using Equation 7.

Eventually, the He ion plasma frequency, the Ar ion plasma frequency, and He ion density, which are three variables, may be calculated from three equations of Equation 4, Equation 5, and Equation 6, and then the Ar ion density may be calculated from Equation 7.

Therefore, when there is a difference between the electron density and the Ar ion density in the mixed gas, plasma process control cannot be accurately performed by measuring only the electron density, and more accurate process control may be possible by measuring the Ar ion density.

In addition, a general ion measurement method according to the related art obtains an approximate value by assuming the Bohm speed in an ion current equation whereas, since the Bohm rate is not considered, the ion density measurement method according to the present invention may be regarded as a more accurate measurement method.

FIG. 12 is a diagram illustrating a specific shape of a transceiver antenna with a probe in the form of a rod.

Referring to FIG. 12, the transceiver antennas 10 and 11 may be used such that the transceiver antenna with a probe in the form of a rod is into plasma.

FIG. 13 is a diagram illustrating specific shapes of a radiation antenna in the form of a rod and a receiving antenna in the form of a loop.

Referring to FIG. 13, the transceiver antennas 10 and 11 may be used such that the radiation antenna in the form of a rod and the receiving antenna in the form of a loop are inserted into plasma, and the receiving antenna is formed in the formed of a loop to increase a reception rate.

FIG. 14 is a diagram illustrating a specific shape of a planar ring-type apparatus for diagnosing plasma.

Referring to FIG. 14, the transceiver antennas 10 and 11 may be formed in a planar shape by arranging a transmitting antenna and a receiving antenna in a coaxial structure, and the receiving antenna may be formed in a ring shape to surround the transmitting antenna, thereby increasing a reception rate.

FIG. 15 is a diagram illustrating a specific shape of a planar cone-type apparatus for diagnosing plasma.

Referring to FIG. 15, in the transceiver antennas 10 and 11, each of a transmitting antenna and a receiving antenna may be formed in the form of a planar cone.

FIG. 16 is a diagram illustrating a specific shape of a planar bar-type apparatus for diagnosing plasma.

Referring to FIG. 16, in each of the transceiver antennas 10 and 11, a transmitting antenna and a receiving antenna may be formed in a planar-type quadrangular shape, and side surfaces of each of the transmitting antenna and the receiving antenna are disposed to face each other to increase an intensity of a transmitted signal so that a reception rate may be increased.

The planar ring-type apparatus for diagnosing plasma, a planar cone-type apparatus for diagnosing plasma, and a planar bar-type apparatus for diagnosing plasma may be used by being embedded in the wall surface of the vacuum chamber 30, the substrate support 70, and the like and used by being embedded in a wafer-type substrate.

FIG. 17 is a flowchart illustrating a method of diagnosing plasma using a device for measuring a plasma ion according to the present invention.

Referring to FIG. 17, when the method of diagnosing plasma according to the present invention employs a plasma process in a semiconductor process or a display process, a more accurate process may be performed using the method of diagnosing plasma.

The method of processing plasma according to the present invention performs generating plasma in the vacuum chamber 30 first (S100) and inserting the transceiver antenna 10 into the vacuum chamber 30 to apply and receive a microwave, of which a frequency is varied, to and from the plasma in the vacuum chamber 30 (S200).

The frequency analyzer 20 performs analyzing the frequency of the microwave received by the transceiver antenna 10 and measuring a cut-off frequency (S300). When the frequency of the microwave is varied in the range of 0 MHz to 10 MHz, an ion plasma frequency which is the cut-off frequency may be measured. When the frequency of the microwave is varied in the range of 0.5 GHz to 2 GHz, an electron plasma frequency which is the cut-off frequency may be measured.

Next, converting the cut-off frequency measured by the frequency analyzer 20 into a plasma ion density or a plasma electron density is performed (S400), and comparing the plasma ion density, which is converted by a converter, with the plasma electron density is performed (S500).

In this regard, as described above with reference to Equations 4 to 7 and FIG. 9B, a He ion plasma frequency, an Ar ion plasma frequency, and a He ion density, which are three variables, may be calculated using three Equations 4, 5, and 6, an Ar ion density may be calculated using Equation 7, and then the Ar ion density may be compared to the He ion density.

Although a comparator is not shown in the drawing, the power controller 41 performs controlling power supplied from the power supply 40 applied for plasma generation according to a difference between the plasma ion density and the plasma electron density, which are compared by the comparator (S600). When the difference is present between the plasma electron density and the plasma ion density in a mixed gas, plasma process control cannot be accurately performed by measuring only the plasma electron density, and more accurate process control may be possible by measuring the plasma ion density.

In addition, the method of diagnosing plasma may be implemented as a computer program, and each component of the present invention may be implemented as hardware or software.

In accordance with the present invention, there is an effect of allowing an ion density in plasma to be measured.

In addition, in accordance with the present invention, there is another effect of measuring the ion density in the plasma to allow a plasma density to be accurately measured.

In addition, in accordance with the present invention, there is still another effect of measuring the ion density in the plasma and comparing the ion density with an electron density to allow movement of ions to be accurately controlled in a thin film deposition process.

The effects according to the present invention are not limited to the above effects, and other effects not explicitly indicated above can be easily understood by those skilled in the art through the configurations and operations in the detailed description of the present invention.

What is claimed is:

1. A device for measuring a plasma ion density, comprising:
    a transceiver antenna configured to apply and receive a microwave, of which a frequency is varied, to and from plasma; and
    a frequency analyzer configured to analyze one frequency of the microwave received from the transceiver antenna and measure a cut-off frequency of mass center momentum of a plurality of types of ions,
    wherein the frequency of the microwave applied to the plasma is varied in a range of 100 kHz to 500 MHz.

2. The device of claim 1, further comprising a converter configured to convert the cut-off frequency, which is measured by the frequency analyzer, into the plasma ion density.

3. The device of claim 1, wherein the transceiver antenna includes a probe-type antenna.

4. The device of claim 1, wherein the transceiver antenna includes a loop-type antenna.

5. The device of claim 1, wherein the transceiver antenna includes a planar ring-type antenna.

6. The device of claim 1, wherein the transceiver antenna includes a planar cone-type antenna.

7. The device of claim 1, wherein the transceiver antenna includes a planar bar-type antenna.

8. A method of diagnosing plasma, comprising:
    generating plasma in a vacuum chamber;
    applying and receiving a microwave, of which a frequency is varied in the vacuum chamber, to and from the plasma;
    analyzing the frequency of the microwave received from a transceiver antenna and measuring a cut-off frequency;
    converting the cut-off frequency, which is measured by a frequency analyzer, into a plasma ion density and a plasma electron density; and
    comparing the plasma ion density with the plasma electron density, which are converted by a converter.

* * * * *

UNITED STATES PATENT AND TRADEMARK OFFICE
CERTIFICATE OF CORRECTION

PATENT NO. : 11,735,397 B2
APPLICATION NO. : 17/222937
DATED : August 22, 2023
INVENTOR(S) : Hyo Chang Lee et al.

It is certified that error appears in the above-identified patent and that said Letters Patent is hereby corrected as shown below:

In the Specification

Under heading "BACKGROUND" and subheading "1. Field of the Invention", on Lines 26-37 (Column 1), please change:
"The present invention relates to research which was carried out under the support of a material innovation program (1711120490/2020M3H4A3106004 and 51% contribution) of the National Research Foundation of Korea (NFR) receiving research funding from the Ministry of Science and ICT, a research and development (R&D) convergence program (1711062007/CAP-17-02-NFRI-01) of the National Research Council of Science & Technology (NST), a future-leading convergence research project (CRC-20-01-NFRI), and the Korea Research Institute of Standards and Science (KRISS)."

To:
"The present invention relates to research which was carried out under the support of a material innovation program (1711120490/2020M3H4A3106004 and 51% contribution), a research and development (R&D) convergence program (1711062007/CAP-17-02-NFRI-01) of the National Research Council of Science & Technology (NST), a future-leading convergence research project (CRC-20-01-NFRI), and the Korea Research Institute of Standards and Science (KRISS), and a R&D special zone fostering program (2022-DD-RD-0030-01/1711177856) of Korea Innovation Foundation receiving research funding from the Ministry of Science and ICT."

Signed and Sealed this
Twelfth Day of December, 2023

*Katherine Kelly Vidal*

Katherine Kelly Vidal
*Director of the United States Patent and Trademark Office*